(12) United States Patent
Kadota et al.

(10) Patent No.: US 6,531,937 B2
(45) Date of Patent: Mar. 11, 2003

(54) EDGE REFLECTION TYPE SURFACE ACOUSTIC WAVE FILTER

(75) Inventors: Michio Kadota, Kyoto (JP); Junya Ago, Nagaokakyo (JP); Hideya Horiuchi, Nagaokakyo (JP); Mamoru Ikeura, Nagaokakyo (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/788,893

(22) Filed: Feb. 20, 2001

(65) Prior Publication Data

US 2001/0017578 A1 Aug. 30, 2001

(30) Foreign Application Priority Data

Feb. 28, 2000 (JP) ........................................ 2000-051795

(51) Int. Cl.⁷ ................................................. H03H 9/64
(52) U.S. Cl. ..................... 333/193; 310/313 B; 333/133
(58) Field of Search ................................ 333/193–196, 333/133

(56) References Cited

U.S. PATENT DOCUMENTS 5,977,686 A    11/1999  Kadota et al. .......... 310/313 B
6,150,900 A  * 11/2000  Kadota et al. .............. 333/133
6,297,713 B1 * 10/2001  Kadota et al. .............. 333/133

FOREIGN PATENT DOCUMENTS

| CN | 373367 | | 1/1999 | |
| GB | 2338129 | * | 12/1999 | |
| JP | 60-41809 | * | 3/1985 | ................. 333/195 |
| JP | 61-6919 | | 1/1986 | |
| JP | 7-131283 | | 5/1995 | |
| JP | 2000-59175 | * | 2/2000 | |

OTHER PUBLICATIONS

Masaaki ONO et al., "Surface Shear Wave Resonators for VHF Range Utilizing Reflection at edge surfaces", vol. 84 No. 58, Jun. 1984, pp. 79–85.

* cited by examiner

Primary Examiner—Robert Pascal
Assistant Examiner—Barbara Summons
(74) Attorney, Agent, or Firm—Keating & Bennett, LLP

(57) ABSTRACT

An edge reflection type surface acoustic wave filter includes a piezoelectric substrate having two opposing edges and at least one interdigital transducer. The interdigital transducer includes split electrodes of paired electrode fingers arranged on the piezoelectric substrate such that a shear horizontal (SH-type) surface acoustic wave is excited on the piezoelectric substrate and is reflected between the two opposing edges. Each of the edges is preferably located at a distance of at least about $\lambda/2-5\lambda/128$ from a center of the paired equipotential electrode fingers, located at the respective outermost portions, in the surface acoustic wave propagation direction, of the interdigital transducer and less than about $\lambda/2$ from the center of the paired equipotential electrode fingers, where $\lambda$ is a wavelength of the SH-type surface acoustic wave excited on the piezoelectric substrate.

18 Claims, 10 Drawing Sheets

EDGE REFLECTION TYPE SURFACE ACOUSTIC WAVE FILTER

BACKGROUND OF THE INVENTION

1. Field of the Invention

The present invention relates to a surface acoustic wave filter used as, for example, a bandpass filter in a mobile communication apparatus and, more particularly, as an edge reflection type surface acoustic wave filter utilizing an SH-type (shear horizontal wave type) surface acoustic wave, such as a BGS (Bleustein-Gulyaev-Shimizu) wave, or a Love wave.

2. Description of the Related Art

An edge reflection type surface acoustic wave filter of an SH-type does not require reflectors. Therefore, because the filter can be miniaturized, various edge reflection type surface acoustic wave filters have been proposed (for example, U.S. Pat. No. 5,977,686).

In an edge reflection type surface acoustic wave filter, at least one interdigital transducer (hereinafter, referred to as an IDT) is provided. An SH-type surface acoustic wave excited by this IDT is reflected between two opposing edges of a piezoelectric substrate, a standing wave is generated, and a bandpass filter is constructed by utilizing the resonance characteristic based on the standing wave. This type of IDT includes electrode fingers that are interdigitated with each other. In addition to the IDT using so-called single electrodes where electrode fingers connected to different potentials are alternately arranged, an IDT using so-called split electrodes where one single electrode is split into a pair of electrode fingers is also known.

In the above edge reflection type surface acoustic wave filter, insertion loss is dependent upon the type of piezoelectric substrate used. Therefore, where the same piezoelectric substrate is used, it is difficult to substantially reduce loss.

SUMMARY OF THE INVENTION

To overcome the above-described problems with the prior art, preferred embodiments of the present invention provide an edge reflection type surface acoustic wave filter in which loss is greatly reduced even where the same piezoelectric substrate is used.

According to a preferred embodiment of the present invention, an edge reflection type surface acoustic wave filter includes a piezoelectric substrate having two opposing edges and at least one interdigital transducer. The interdigital transducer includes split electrodes of paired electrode fingers that are arranged on the piezoelectric substrate such that an SH-type surface acoustic wave is excited on the piezoelectric substrate and is reflected between the two opposing edges. Each of the edges is located at a distance of at least approximately $\lambda/2-5\lambda/128$ from the center of the paired equipotential electrode fingers, located at the respective outermost portions in the surface acoustic wave propagation direction, of the interdigital transducer and less than about $\lambda/2$ from the center of the paired equipotential electrode fingers, where $\lambda$ is a wavelength of the SH-type surface acoustic wave which is excited on the piezoelectric substrate.

It is preferable that each of the edges of the piezoelectric substrate is positioned between about $\lambda/2-\lambda/32$ and about $\lambda/2-\lambda/64$ from the center of the respective outermost paired equipotential electrode fingers.

In a preferred embodiment, a reflection type surface acoustic wave filter according to the present invention defines a transversely coupled type resonator filter, longitudinally coupled type resonator filter, or ladder-type filter or other suitable filter.

In another preferred embodiment of the present invention, an antenna duplexer including an edge reflection type surface acoustic wave filter according to the present invention is provided.

Furthermore, in yet another preferred embodiment of the present invention, a communication device having the above-described antenna duplexer is provided.

According to preferred embodiments of the present invention, by setting the edges of the piezoelectric substrate at the aforementioned specific location, insertion loss is greatly decreased. Furthermore, by adjustment of the location of the above-described edges, the frequency is adjusted.

When a transversely coupled type resonator filter, longitudinally coupled type resonator filter, or ladder-type filter is constructed according to various preferred embodiments of the present invention, a transversely coupled type resonator filter, a longitudinally coupled type resonator filter, and a ladder-type filter which have low loss are constructed using split electrodes.

In an antenna duplexer constructed by using edge reflection type surface acoustic wave filters according to various preferred embodiments of the present invention, loss in the antenna duplexer is greatly decreased.

Furthermore, in a communication device provided with an antenna duplexer according to a preferred embodiment of the present invention, because an antenna duplexer having low loss is provided as described above, loss in the overall communication device is greatly decreased.

For the purpose of illustrating the invention, several preferred embodiments are shown in the drawings, it being understood, however, that the invention is not limited to the precise arrangements and elements shown.

Other features, elements, advantages and characteristics of the present invention will become more apparent from the detailed description of preferred embodiments thereof with reference to the attached drawings.

DETAILED DESCRIPTION OF PREFERRED EMBODIMENTS

Hereinafter, an example of an edge reflection type surface acoustic wave filter according to preferred embodiments of the present invention will be described with reference to drawings.

Figure 1:
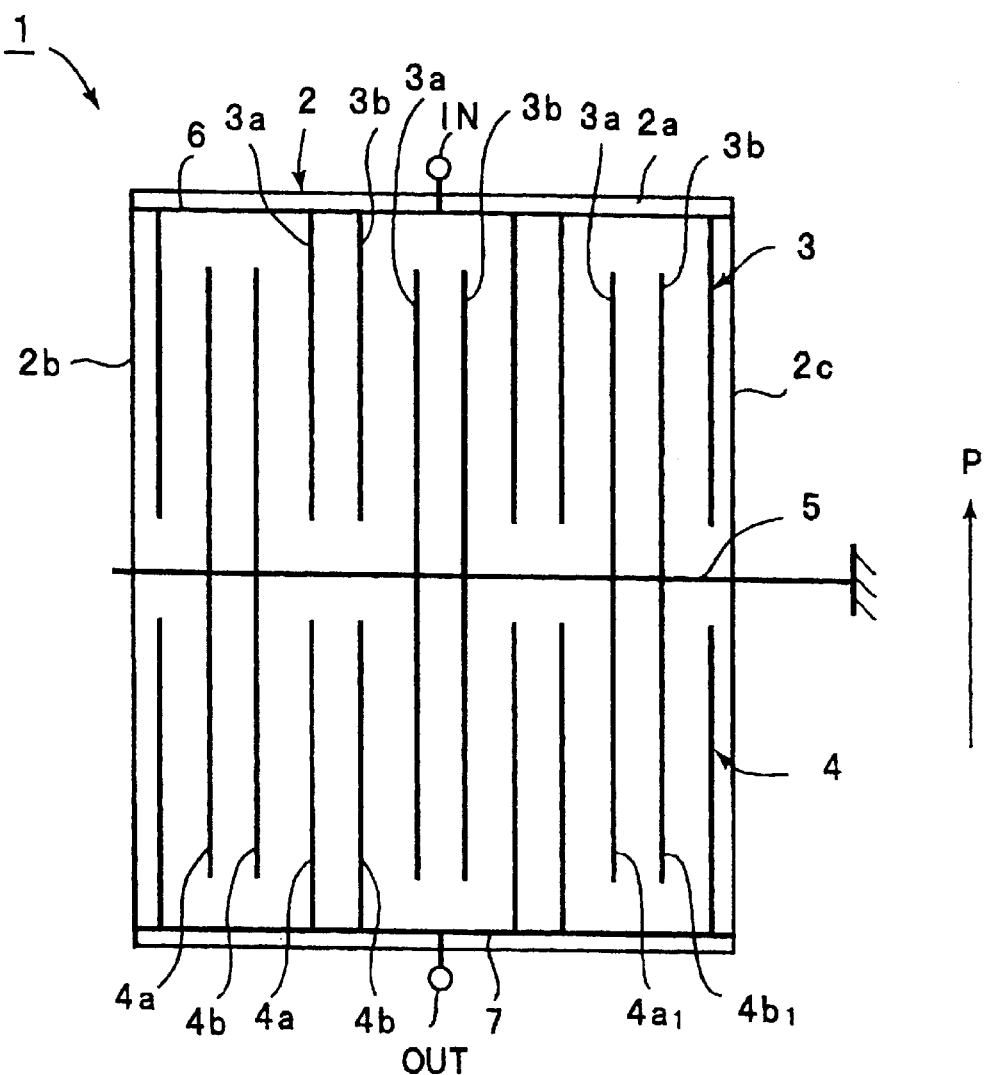
FIG. 1 is a schematic top view showing an edge reflection type surface acoustic wave filter defining a transversely coupled type resonator filter according to a preferred embodiment of the present invention.

FIG. 1 is a schematic top view of an edge reflection type surface acoustic wave filter according to one preferred embodiment of the present invention.

The edge reflection type surface acoustic wave filter 1 preferably includes a piezoelectric substrate 2 and two IDTs 3 and 4 provided on the piezoelectric substrate 2. In the present preferred embodiment, the IDTs 3 and 4 are aligned in a direction that is substantially perpendicular to the surface acoustic wave propagation direction and a transversely coupled type resonator filter is provided.

The piezoelectric substrate 2 is constructed using, for example, piezoelectric single crystals such as $LiTaO_3$, $LiNbO_3$, quartz, or other suitable piezoelectric single crystals, or piezoelectric ceramics, such as ceramics of a lead titanate zirconate type, or other suitable ceramics. When the piezoelectric substrate 2 is defined by a piezoelectric ceramic, polarization treatment is performed in the direction of arrow P as illustrated. That is, the direction is substantially perpendicular to a surface acoustic wave propagation direction (described later) and the polarization treatment is performed in a direction that is substantially parallel to the upper surface 2a of the piezoelectric substrate 2.

The IDTs 3 and 4 have a pair of comb electrodes of split electrodes both of which are configured to be inserted into each other. Each split electrode is defined by paired electrode fingers 3a, 3b, 4a, and 4b.

The IDTs 3 and 4 are preferably made of an appropriate conductive material such as aluminum, alloys containing aluminum as the main component, or other suitable conductive material.

The electrode fingers 3a, 3b, 4a, and 4b extend in the direction that is substantially perpendicular to a surface acoustic wave propagation direction.

In the edge reflection type surface acoustic wave filter 1 of the present preferred embodiment, the bus bar of one comb electrode of the IDT 3 and the bus bar of one comb electrode of the IDT 4 are common to define a common bus bar 5.

A bus bar 6 on the opposite side to the common bus bar of the IDT 3 is connected to an input terminal IN, the common bus bar is grounded, and by applying an input voltage, an output is fed out from an output terminal OUT connected to a bus bar 7 on the opposite side to the common bus bar of the IDT 4.

One of the characteristics of the edge reflection type surface acoustic wave filter 1 of the present preferred embodiment is that the location of edges 2b and 2c where a surface acoustic wave is reflected is inside the location of about $\lambda/2$ and at or outside the location of about ($\lambda/2-5\lambda/128$), on the outside in the surface acoustic wave propagation direction, from the center of the paired equipotential electrode fingers, for example, of the electrode fingers $4a_1$ and $4b_1$, located at the outermost in the surface acoustic wave propagation direction, of the IDTs 3 and 4. This will be described with reference to FIGS. 2 to 6.

The edge reflection type surface acoustic wave filter 1 defining a transversely coupled type resonator filter is constructed as in the following example.

Figure 2:
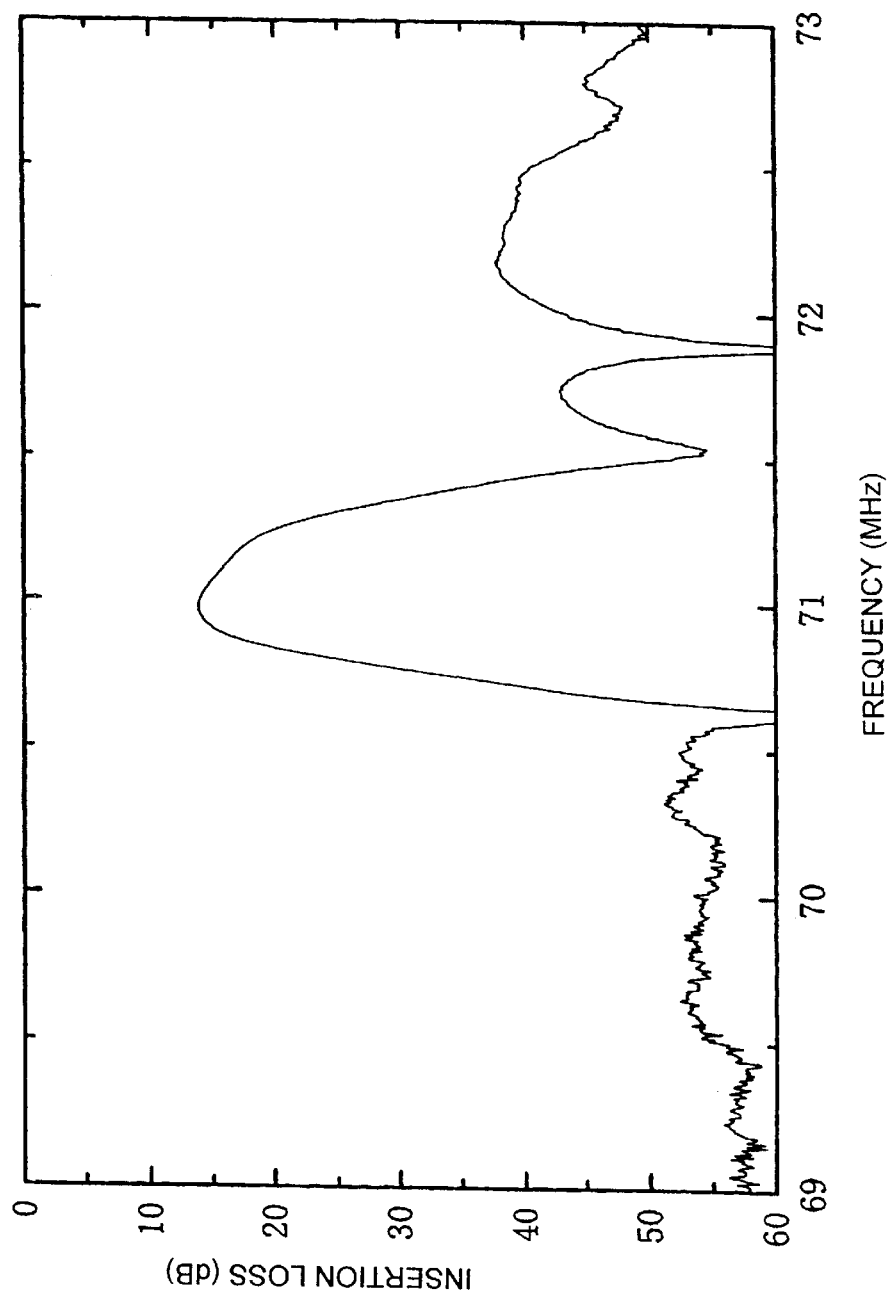
FIG. 2 shows the frequency characteristic of an edge reflection type surface acoustic wave filter constructed in the same way as the edge reflection type surface acoustic wave filter of the preferred embodiment shown in FIG. 1.

By using a PZT substrate having the approximate dimensions of 1.5×2.0×0.5 mm for the piezoelectric substrate 2, four-stage transversely coupled resonator type filters were provided. Thirty-four (34) pairs of electrode fingers of the IDTs 3 and 4 in each transversely coupled resonator type filter were provided and the cross width of the electrode fingers was about 1.3 λ. In this edge reflection type surface acoustic wave filter 1, the location of the edges 2b and 2c was about $\lambda/2-\lambda/32$, on the outside in the surface acoustic wave propagation direction, from the center of the outermost paired equipotential electrode fingers. The frequency characteristic of this edge reflection type surface acoustic wave filter is shown in FIG. 2. As is clearly understood from FIG. 2, an edge reflection type surface acoustic wave filter which has about 71 MHz as the center frequency and a bandwidth as narrow as about 290 kHz and which is of very low loss is provided.

In the present preferred embodiment, as the edges 2b and 2c are preferably in the above-described range, greatly reduced loss is achieved.

That is, the inventors of preferred embodiments of the present invention have found that in edge reflection type surface acoustic wave filters 1 using split electrodes, when the edges 2a and 2b are in the above specific range, greatly reduced loss is achieved, and the inventors thus arrived at the present invention. This will be described based on specific examples of preferred embodiments of the present invention.

When the above-described edge reflection type surface acoustic wave filter is constructed, by variously changing the location of the edges 2b and 2c, a plurality of types of edge reflection type surface acoustic wave filters were constructed and their characteristics were evaluated. That is, as shown in a schematic expanded top view in FIG. 3, by cutting each of the piezoelectric substrates at the location shown by A to F in FIG. 3, on the outside in the surface acoustic wave propagation direction, from the center of the electrode fingers $4a_1$ and $4b_1$ of the outermost electrode, in the surface acoustic wave propagation direction, of the IDT 4, the end surface 2c was provided. Moreover, the outermost paired equipotential electrode fingers are the outermost pair of the electrode fingers $4a_1$ and $4b_1$, and an electrode finger $4a_2$ in FIG. 3 does not include the other electrode finger defining a pair of electrode fingers together with the electrode finger $4a_2$ when the location of the edge is at A to E in FIG. 3, and accordingly the electrode finger $4a_2$ does not constitute the outermost paired electrode fingers. The location shown by C in FIG. 3 corresponds to the location which is $\lambda/2$ away, on the outside in the surface acoustic wave propagation direction, from point X.

Figure 3:
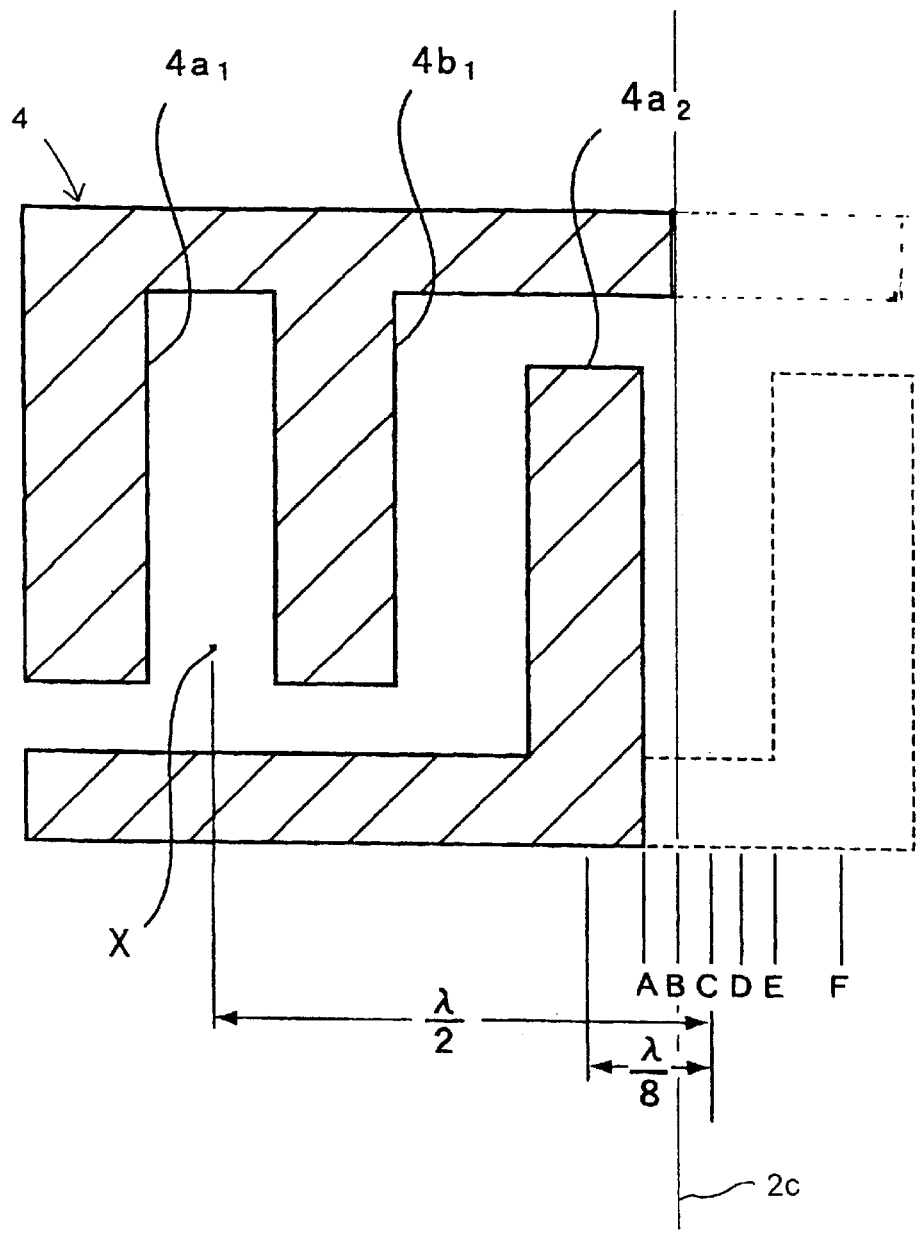
FIG. 3 is a schematic partially enlarged top view for describing the relationship between the location of the edge and the center of the electrode fingers of the outermost split electrode in the surface acoustic wave propagation direction in the edge reflection type surface acoustic wave filter shown in FIG. 1.

Furthermore, A to E correspond to the outside locations of $A=\lambda/2-\lambda/16$, $B=\lambda/2-\lambda/32$, $C=\lambda/2$, $D=\lambda/2+\lambda/32$, $E=\lambda/2+\lambda/16$, and $F=\lambda/2+\lambda/8$ from X, respectively. FIG. 3 shows that the edge 2c of the piezoelectric substrate 2 is located at the position B, i.e., at the distance of $(\lambda/2-\lambda/32)$ from the center X of the outermost paired electrode fingers $4a_1$ and $4b_1$.

The frequency characteristic of each edge reflection type surface acoustic wave filter obtained as described above is shown in FIG. 4.

Figure 4:
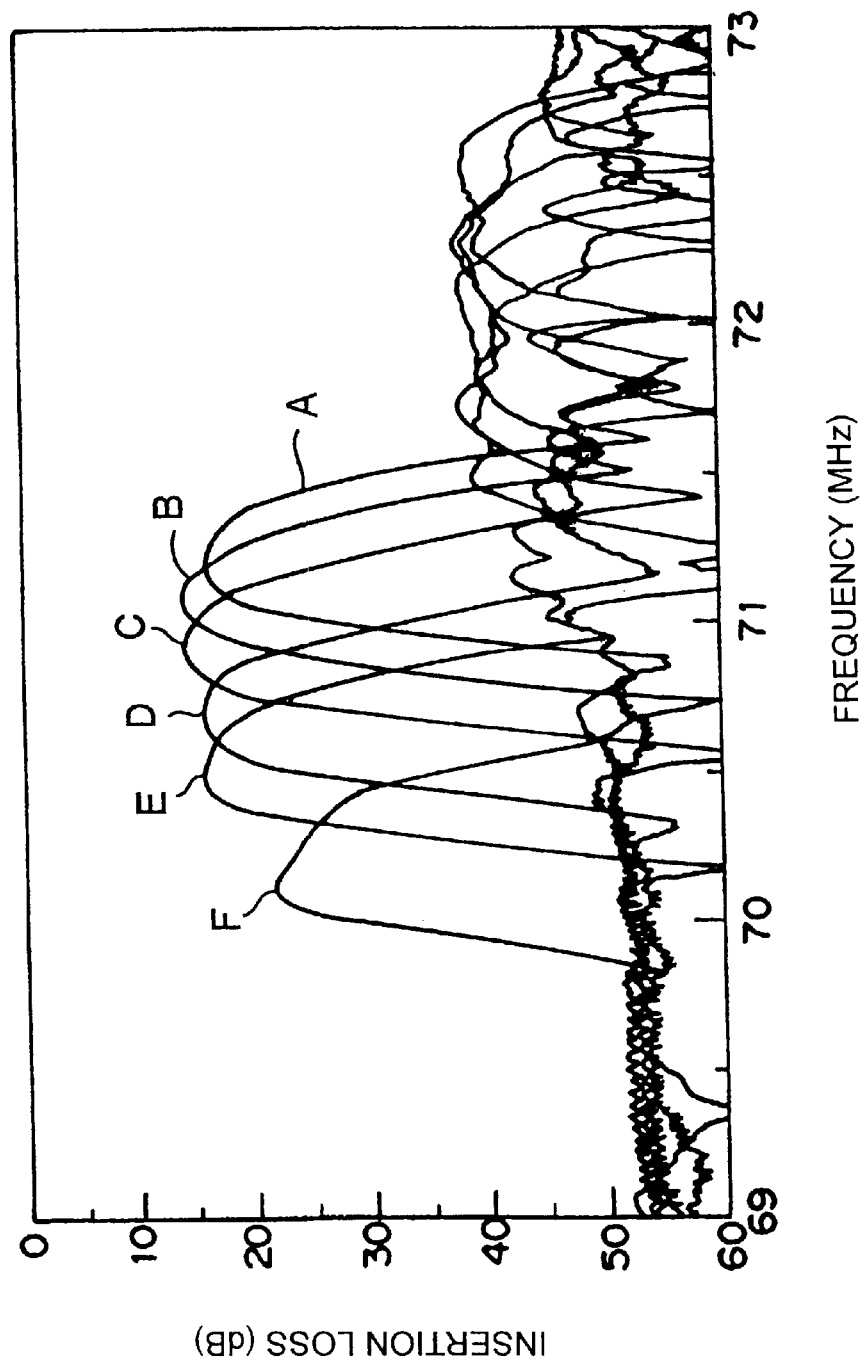
FIG. 4 shows the frequency characteristics of the edge reflection type surface acoustic wave filters constructed such that the locations of the edges differ from each other.

A to F in FIG. 4 shows the frequency characteristic of the edge reflection type surface acoustic wave filter in which the location of the above-mentioned edge is A to F in FIG. 3. The insertion loss of the characteristic shown by A to F in FIG. 4 is as in the following. That is, A: 15.7 dB, B: 14.3 dB, C: 14.2 dB, D: 15.4 dB, E: 15.7 dB, and F: 21.6 dB. Accordingly, it is understood that, by changing the location of the edge, not only the center frequency, but also the insertion loss, changes.

Figure 5:
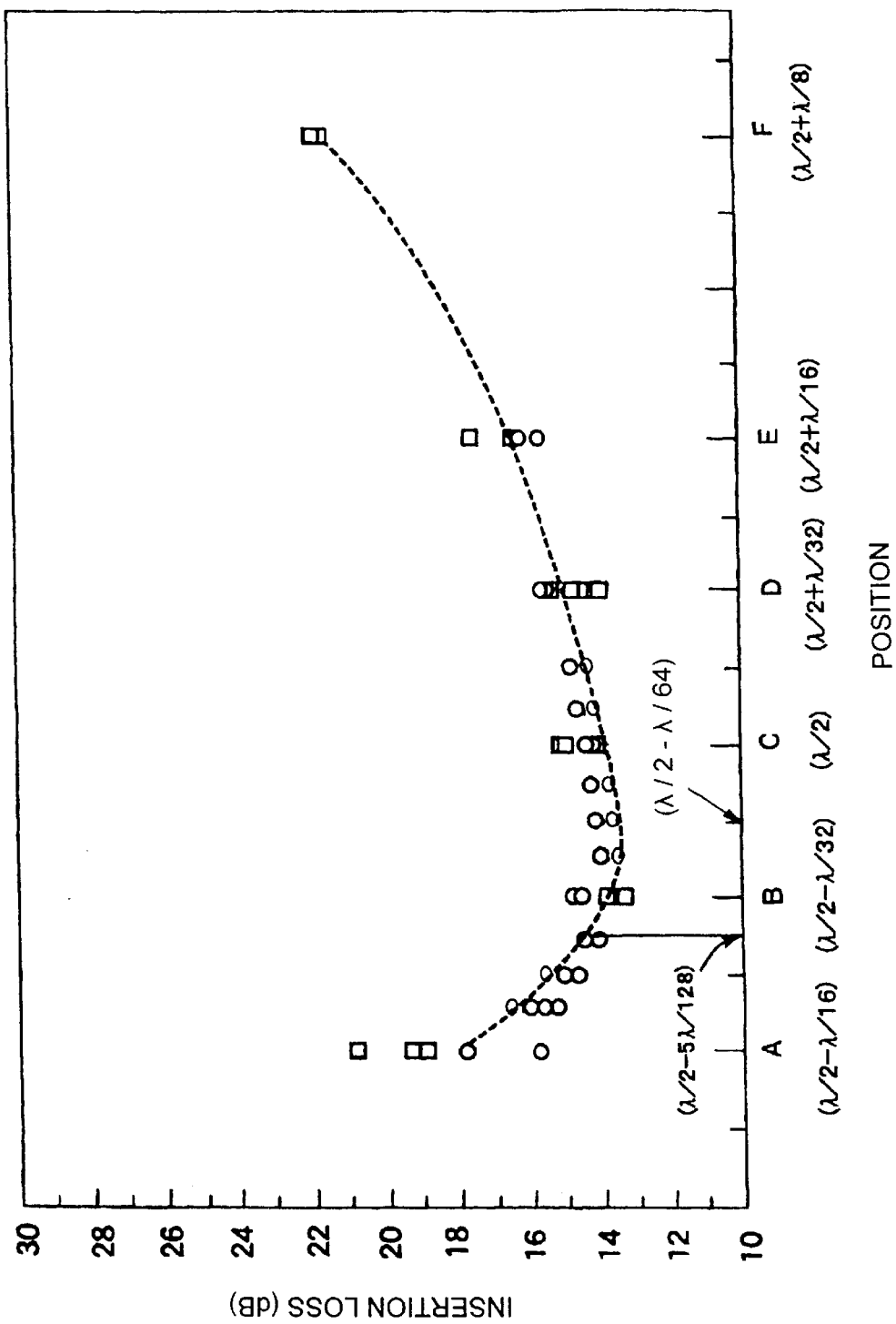
FIG. 5 shows the relationship between the location of edges and insertion loss in edge reflection type surface acoustic wave filters.

The relationship between the location of the above edges and the insertion loss plotted based on the result in FIG. 4 is shown in FIG. 5.

As is clearly seen in FIG. 5, it is understood that, even if the edge is inside the location of about $\lambda/2$ on the outside in the surface acoustic wave propagation direction, from the above point X, when the edge is outside the location of about $(\lambda/2-5\lambda/128)$, the insertion loss is less than that at the location of about $\lambda/2$ on the outside. That is, it is understood that, by locating the edge inside the position approximately $\lambda/2$ away and at or outside the position of about $\lambda/2-5\lambda/128$ away from X, on the outside in the surface acoustic wave propagation direction, the insertion loss is greatly reduced. It is understood that, more preferably, by locating the edge at or inside the position which is about $\lambda/2-\lambda/64$ away and at or outside the position which is about $\lambda/2-\lambda/32$ away, on the outside in the surface acoustic wave propagation direction, from point X, the insertion loss is even further reduced.

Figure 6:
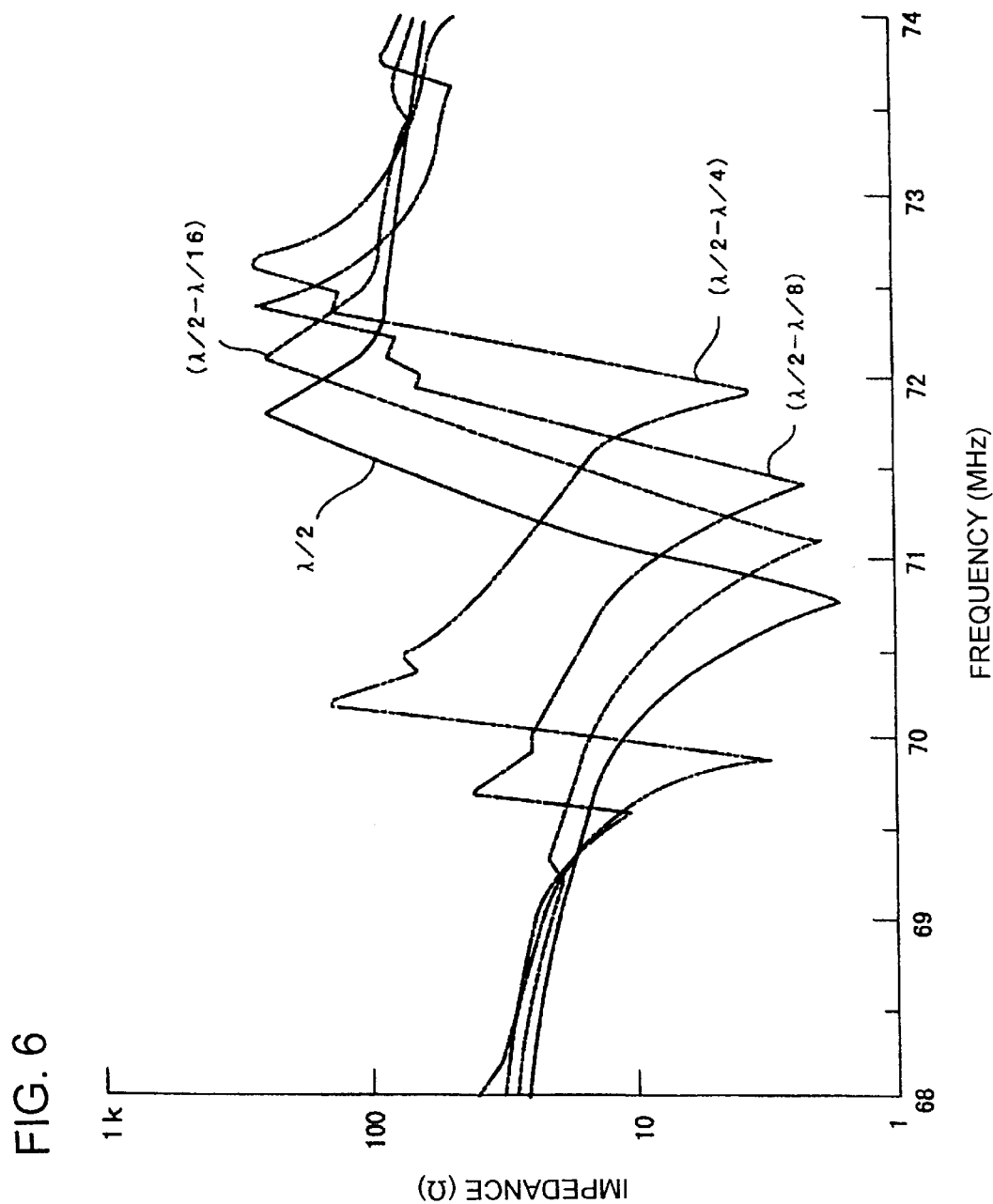
FIG. 6 shows the impedance-frequency characteristics of the resonators of edge reflection type surface acoustic wave filters in which the location of edges is varied.

Furthermore, FIG. 6 shows the impedance-frequency characteristic of each when the location of the edge is about $\lambda/2$, about $\lambda/2-\lambda/16$, about $\lambda/2-\lambda/8$, and about $\lambda/2-\lambda/4$ away, on the outside in the surface acoustic wave propagation direction, from X. As is clearly seen in FIG. 6, even if the location of the above edge is set in the above-mentioned specific range, the ratio of peak to valley, and, the bandwidth are seldom affected in the impedance-frequency characteristic and are not substantially influenced by large spurious signals.

Therefore, according to preferred embodiments of the present invention, by setting the location of the edge of an edge reflection type surface acoustic wave filter 1 in the above specific range, low insertion loss and excellent filtering characteristics are achieved.

Figure 7:
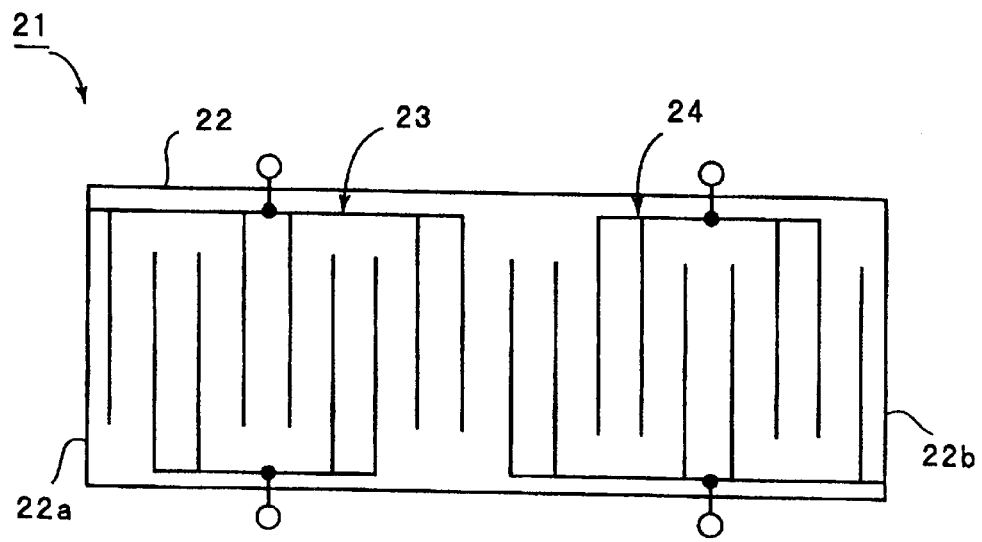
FIG. 7 is a schematic top view for describing a longitudinally coupled type resonator filter to which preferred embodiments of the present invention are applied.
Figure 8:
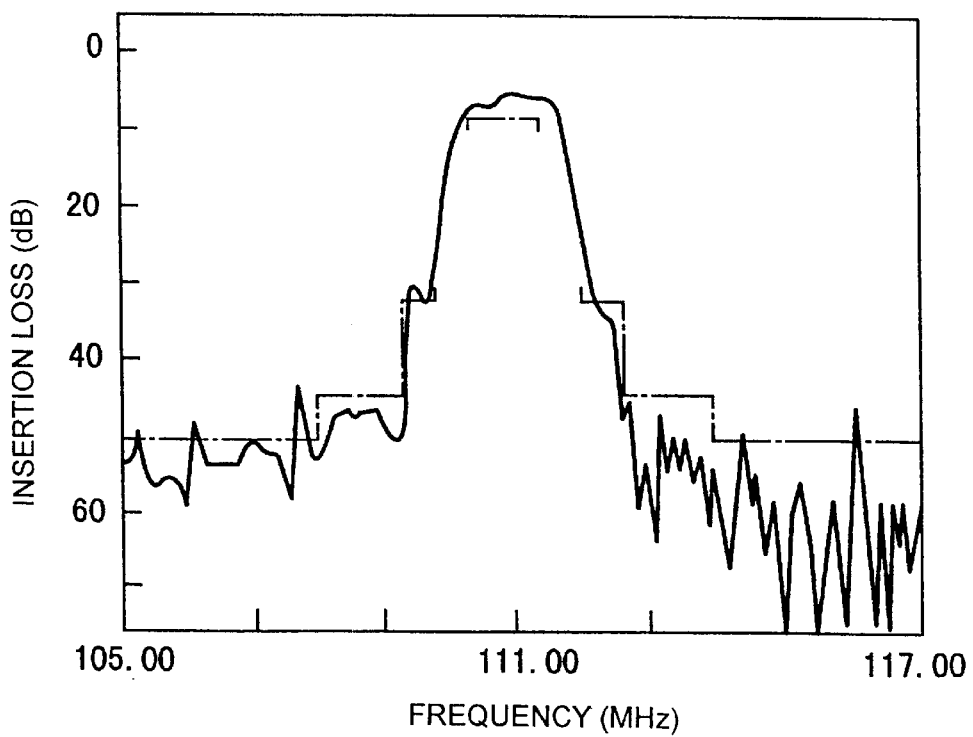
FIG. 8 shows the frequency characteristic of the longitudinally coupled type resonator filter shown in FIG. 7.

In the above-described preferred embodiment, the example where an edge reflection type surface acoustic wave filter according to preferred embodiments the present invention is applied to a transversely coupled type resonator filter was shown, but the filter can be also applied to a longitudinally coupled type resonator filter shown in FIG. 7. In the longitudinally coupled type resonator filter 21 shown in FIG. 7, two IDTs 23 and 24 are aligned along the surface acoustic wave propagation direction. Also in the edge reflection type surface acoustic wave filter 21, by setting the location of the edges 22a and 22b of a piezoelectric substrate 22 in the same manner as in the above-described preferred embodiment, insertion loss is greatly reduced. In FIG. 8, one example of frequency characteristics of the edge reflection type surface acoustic wave filter 21 is shown.

Figure 9:
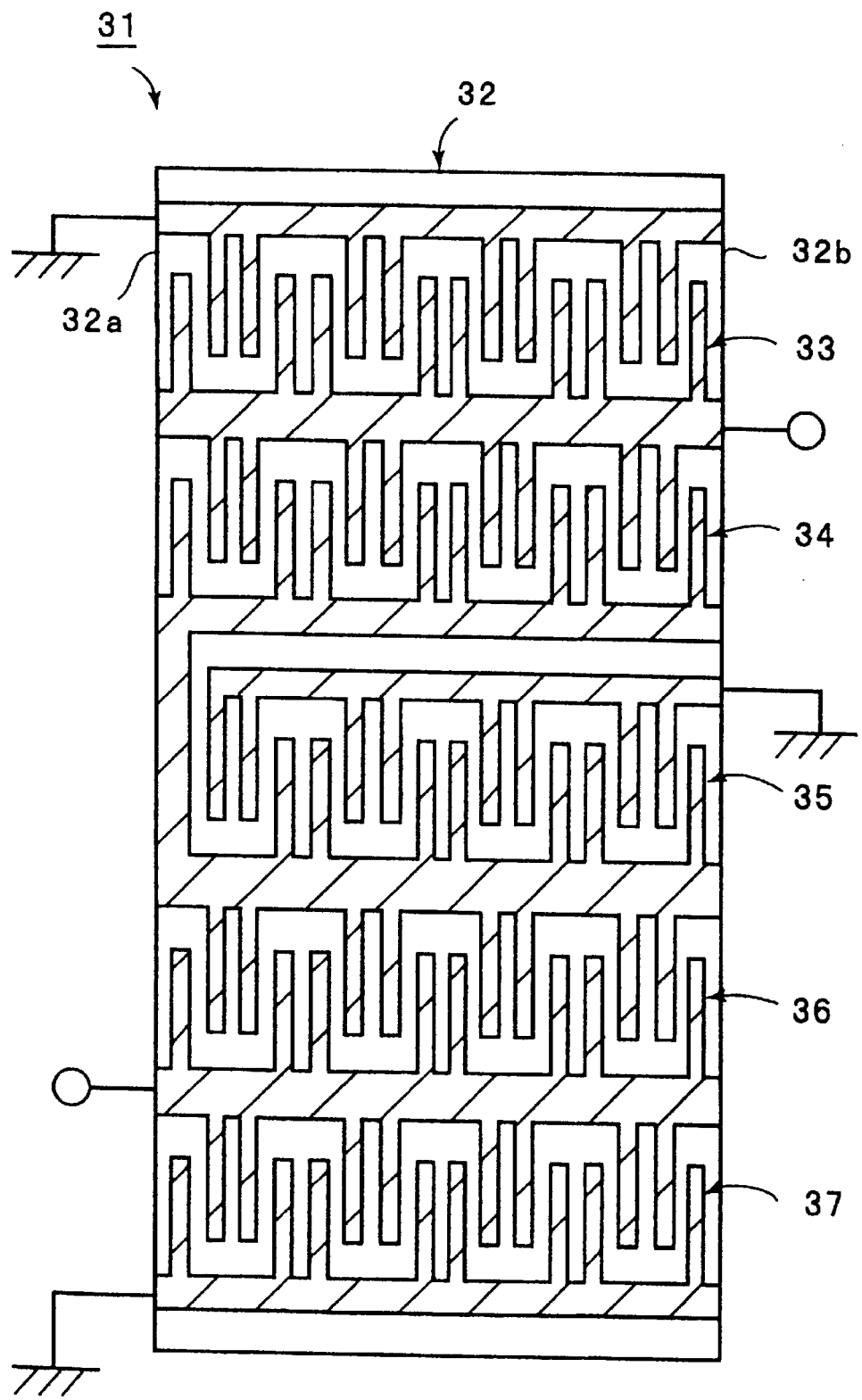
FIG. 9 is a schematic top view showing one example of a ladder-type filter to which preferred embodiments of the present invention are applied.

Furthermore, the edge reflection type surface acoustic wave filter of the present preferred embodiment can also be applied to a ladder-type filter having a plurality of parallel-arm resonators and series-arm resonators. FIG. 9 is a schematic top view for describing one preferred embodiment of a ladder-type filter constructed according to the present invention. In the ladder-type filter 31, a plurality of edge reflection type surface acoustic wave filters 33 to 37 are provided on a piezoelectric substrate 32. Each of the filters 33 to 37 has IDTs in which split electrodes are preferably included. The edge reflection type surface acoustic wave filters 33, 35, and 37 constitute parallel-arm resonators, and the edge reflection type surface acoustic wave filters 34 and 36 constitute series-arm resonators. Also in the ladder-type filter 31, by setting the two opposing edges 32a and 32b on the piezoelectric substrate 32 in the above specific range in the same manner as in the first preferred embodiment, insertion loss is greatly reduced.

Moreover, in preferred embodiments of the present invention, a piezoelectric thin film such as a ZnO thin film, or other suitable piezoelectric thin film on a substrate, besides the above-mentioned piezoelectric substrate, may be used as a piezoelectric substrate.

Next, a preferred embodiment of an antenna duplexer which is constructed using an edge reflection type surface acoustic wave filter according to the present invention is described with reference to FIG. 10.

Figure 10:
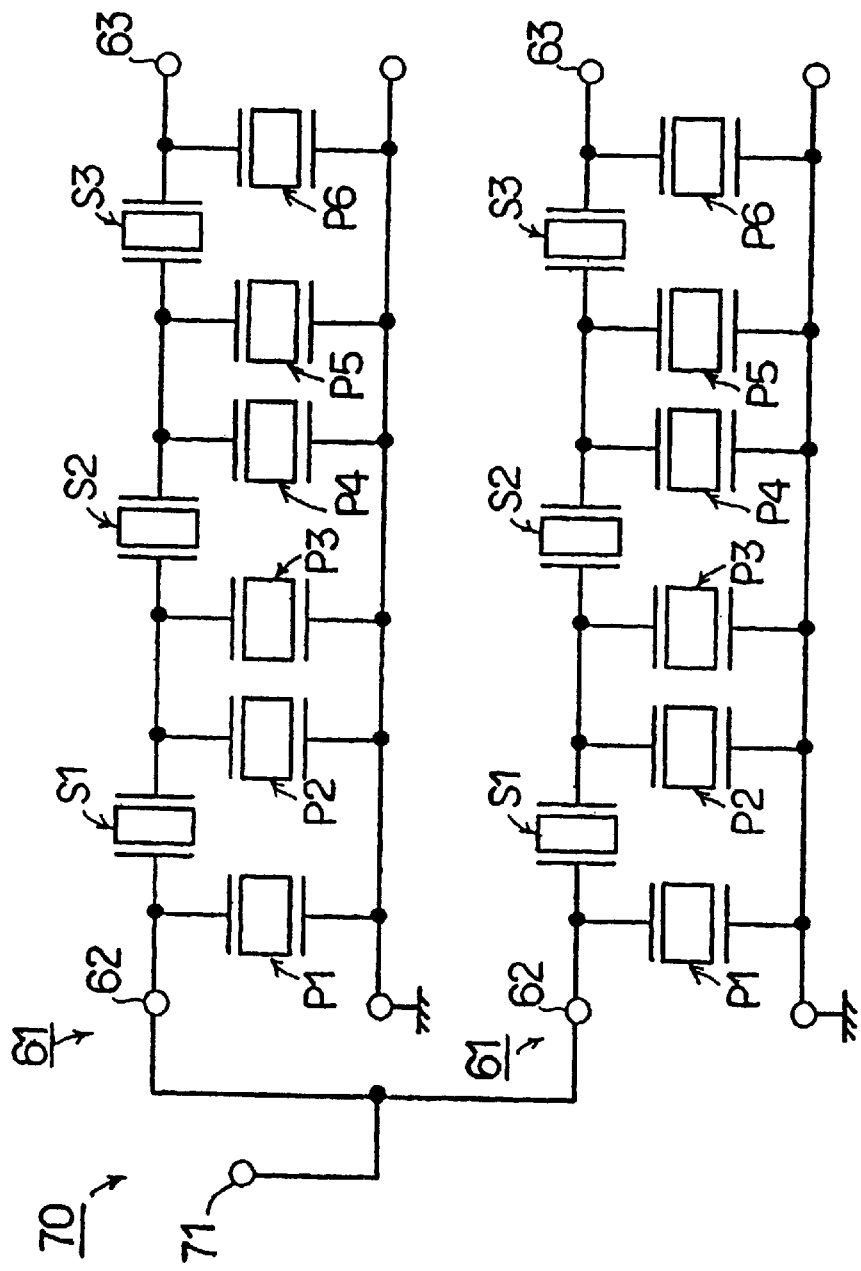
FIG. 10 is a circuit diagram for describing a duplexer constructed by using an edge reflection type surface acoustic wave filter according to a preferred embodiment of the present invention.

FIG. 10 is a circuit diagram for describing an antenna duplexer of the present preferred embodiment. In an antenna duplexer 70 of the present preferred embodiment, a pair of edge reflection type surface acoustic wave filters according to other preferred embodiments of the present invention is used. That is, each of input terminals 62 of ladder-type filters 61 which is commonly connected defines a first port 71. On the other hand, each of output terminals 63 of the ladder-type filters 61 are used, and they define a second and third port, respectively.

Thus, an antenna duplexer is constructed using a pair of ladder-type filters 61.

Figure 11:
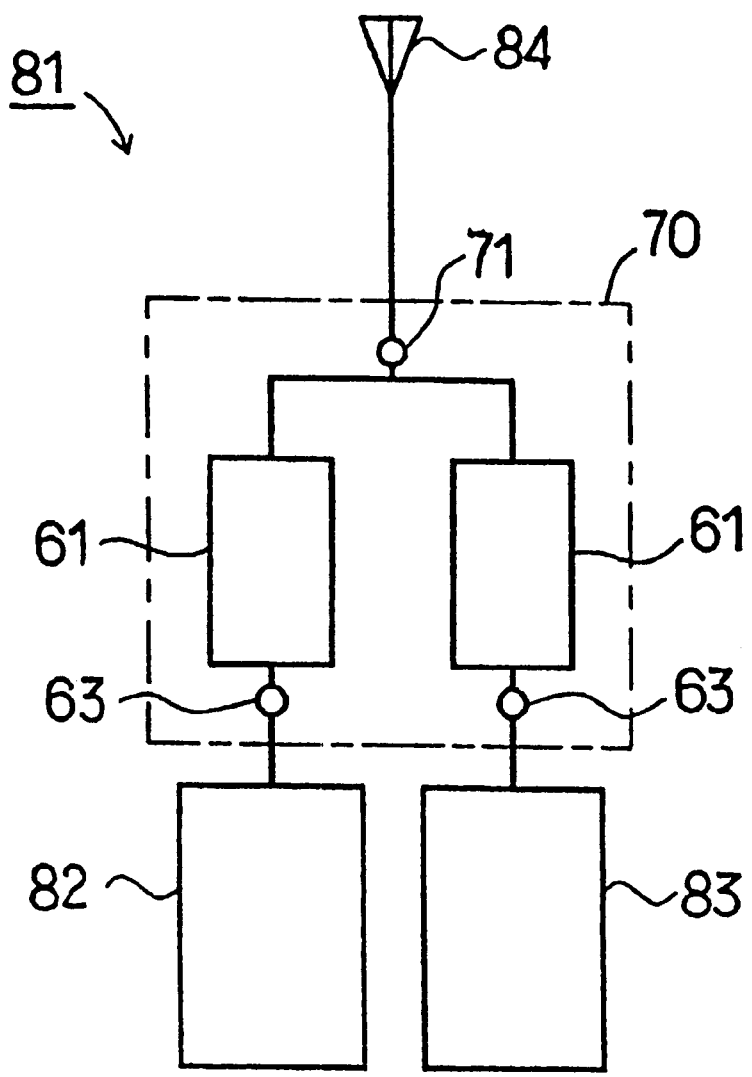
FIG. 11 is a block diagram showing the outline of a communication device using a duplexer according to the present invention.

Furthermore, by using the above antenna duplexer, a communication device is provided. One example of such a communication device is shown in FIG. 11.

A communication device 81 of the present preferred embodiment includes an antenna duplexer 70 and transmission or receiver circuits 82. The first port 71 of the antenna duplexer 70 is connected to an antenna 84 and the output terminals 63 defining the second and third port are connected to the transmission or receiver circuits 82 and 83.

In this antenna duplexer 70, the pair of ladder-type filters 61 are configured to have different passbands, and in that manner the antenna 84 is used as a transmission antenna or a receiver antenna.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An edge reflection type surface acoustic wave filter comprising:

a piezoelectric substrate having two opposing edges; and at least one interdigital transducer defined by split electrodes of paired electrode fingers and provided on the piezoelectric substrate such that an SH-type surface acoustic wave is excited on the piezoelectric substrate and is reflected between the two opposing edges; wherein each of the two opposing edges is located at a distance of at least about $\lambda/2-5\lambda/128$ or more from a center of the paired equipotential respective outermost portions, in the surface acoustic wave propagation direction, of the interdigital transducer and less than about $\lambda/2$ from the center of the paired equipotential electrode fingers, where $\lambda$ is a wavelength of the SH-type surface acoustic wave excited on the piezoelectric substrate; and every electrode finger of said at least one interdigital transducer has an equal width.

2. An edge reflection type surface acoustic wave filter as claimed in claim 1, wherein the edge reflection type surface acoustic wave filter constitutes a transversely coupled type resonator filter.

3. An edge reflection type surface acoustic wave filter as claimed in claim 1, wherein the edge reflection type surface acoustic wave filter constitutes a longitudinally coupled type resonator filter.

4. An edge reflection type surface acoustic wave filter as claimed in claim 1, wherein the edge reflection type surface acoustic wave filter constitutes a ladder-type filter.

5. An edge reflection type surface acoustic wave filter as claimed in claim 1, each of the two opposing edges is located at a distance of at least about $\lambda/2-\lambda/32$ from a center of the paired equipotential electrode fingers, located at the respective outermost portion, in the surface acoustic wave propagation direction, of the interdigital transducer and about $\lambda/2-\lambda/64$ or less from the center of the paired equipotential electrode fingers.

6. An edge reflection type surface acoustic wave filter as claimed in claim 5, wherein the edge reflection type surface acoustic wave filter constitutes a transversely coupled type resonator filter.

7. An edge reflection type surface acoustic wave filter as claimed in claim 5, wherein the edge reflection type surface acoustic wave filter constitutes a longitudinally coupled type resonator filter.

8. An edge reflection type surface acoustic wave filter as claimed in claim 5, wherein the edge reflection type surface acoustic wave filter constitutes a ladder-type filter.

9. An edge reflection type surface acoustic wave filter as claimed in claim 1, wherein said piezoelectric substrate is made of a piezoelectric single crystal.

10. An edge reflection type surface acoustic wave filter as claimed in claim 1, wherein said piezoelectric substrate is made of a piezoelectric ceramic.

11. An edge reflection type surface acoustic wave filter as claimed in claim 1, wherein said at least one interdigital transducer is made of aluminum or an alloy containing aluminum as a main component.

12. An edge reflection type surface acoustic wave filter as claimed in claim 1, wherein said at least one interdigital transducer includes two interdigital transducers aligned in a direction substantially perpendicular to the surface acoustic wave propagation direction.

13. An edge reflection type surface acoustic wave filter as claimed in claim 1, wherein said at least one interdigital transducer includes two interdigital transducers aligned along the surface acoustic wave propagation direction.

14. An edge reflection type surface acoustic wave filter as claimed in claim 1, wherein said at least one interdigital transducer includes a plurality of interdigital transducers, at least two of said plurality of interdigital transducers defining parallel arm resonators, and at least another two of said plurality of interdigital transducers defining series arm resonators.

15. An edge reflection type surface acoustic wave filter as claimed in claim 1, wherein said piezoelectric substrate is defined by a piezoelectric thin film on a substrate.

16. An edge reflection type surface acoustic wave filter as claimed in claim 15, wherein said piezoelectric thin film is a ZnO thin film.

17. An antenna duplexer using an edge reflection type surface acoustic wave filter as claimed in claim 1.

18. A communication device having an antenna duplexer as claimed in claim 17.

* * * * *